(12) United States Patent
McClain et al.

(10) Patent No.: US 11,705,425 B2
(45) Date of Patent: Jul. 18, 2023

(54) THERMOCOMPRESSION BOND TIPS AND RELATED APPARATUS AND METHODS

(71) Applicant: Micron Technology, Inc., Boise, ID (US)

(72) Inventors: Benjamin L. McClain, Boise, ID (US); Brandon P. Wirz, Boise, ID (US); Zhaohui Ma, Boise, ID (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 17/301,843

(22) Filed: Apr. 15, 2021

(65) Prior Publication Data
US 2021/0233887 A1    Jul. 29, 2021

Related U.S. Application Data

(63) Continuation of application No. 15/625,676, filed on Jun. 16, 2017, now Pat. No. 11,024,595.

(51) Int. Cl.
*H01L 23/00* (2006.01)
*H01L 21/48* (2006.01)
*H01L 21/56* (2006.01)

(52) U.S. Cl.
CPC .......... *H01L 24/75* (2013.01); *H01L 21/4853* (2013.01); *H01L 21/563* (2013.01); *H01L 24/27* (2013.01); *H01L 24/32* (2013.01); *H01L 24/73* (2013.01); *H01L 24/81* (2013.01); *H01L 24/83* (2013.01); *H01L 24/92* (2013.01); *H01L 24/13* (2013.01); *H01L 24/16* (2013.01); *H01L 24/94* (2013.01); *H01L 2224/131* (2013.01);
(Continued)

(58) Field of Classification Search
CPC ................................ H01L 24/01; H01L 23/04
See application file for complete search history.

(56) References Cited

U.S. PATENT DOCUMENTS 5,757,068 A * 5/1998 Kata ................. H01L 23/49572
257/676
5,817,545 A * 10/1998 Wang ................. B29C 33/0044
438/126
(Continued)

FOREIGN PATENT DOCUMENTS

CN     101689516 A    3/2008
CN     101490831 A    7/2009
(Continued)

OTHER PUBLICATIONS

Chip Scale Review, The Future of Semiconductor Packaging, ChipScaleReview.com, vol. 19, No. 4, Jul.-Aug. 2015, 68 pages.
(Continued)

*Primary Examiner* — Edward Chin
(74) *Attorney, Agent, or Firm* — TraskBritt

(57) ABSTRACT

A bond tip for thermocompression bonding a bottom surface includes a die contact area and a low surface energy material covering at least a portion of the bottom surface. The low surface energy material may cover substantially all of the bottom surface, or only a peripheral portion surrounding the die contact area. The die contact area may be recessed with respect to the peripheral portion a depth at least as great as a thickness of a semiconductor die to be received in the recessed die contact area. A method of thermocompression bonding is also disclosed.

18 Claims, 5 Drawing Sheets

(52) U.S. Cl.
CPC ............... *H01L 2224/13111* (2013.01); *H01L 2224/13147* (2013.01); *H01L 2224/16227* (2013.01); *H01L 2224/27003* (2013.01); *H01L 2224/2783* (2013.01); *H01L 2224/2784* (2013.01); *H01L 2224/27436* (2013.01); *H01L 2224/32013* (2013.01); *H01L 2224/32058* (2013.01); *H01L 2224/32059* (2013.01); *H01L 2224/32105* (2013.01); *H01L 2224/32106* (2013.01); *H01L 2224/32225* (2013.01); *H01L 2224/73103* (2013.01); *H01L 2224/73204* (2013.01); *H01L 2224/7532* (2013.01); *H01L 2224/75251* (2013.01); *H01L 2224/75252* (2013.01); *H01L 2224/75303* (2013.01); *H01L 2224/75312* (2013.01); *H01L 2224/75318* (2013.01); *H01L 2224/75745* (2013.01); *H01L 2224/8182* (2013.01); *H01L 2224/81169* (2013.01); *H01L 2224/81191* (2013.01); *H01L 2224/81193* (2013.01); *H01L 2224/81203* (2013.01); *H01L 2224/81815* (2013.01); *H01L 2224/81895* (2013.01); *H01L 2224/83203* (2013.01); *H01L 2224/83862* (2013.01); *H01L 2224/9211* (2013.01); *H01L 2224/9212* (2013.01); *H01L 2224/94* (2013.01)

(56) References Cited

U.S. PATENT DOCUMENTS

| | | | | |
|---|---|---|---|---|
| 6,160,309 | A * | 12/2000 | Le | H01L 23/051 257/E23.187 |
| 6,187,613 | B1 * | 2/2001 | Wu | H01L 24/28 438/126 |
| 6,309,915 | B1 * | 10/2001 | Distefano | H01L 24/01 438/126 |
| 6,703,299 | B2 * | 3/2004 | Shi | H01L 24/29 257/E21.503 |
| 8,967,452 | B2 | 3/2015 | Cheung et al. | |
| 9,093,549 | B2 | 7/2015 | Wasserman et al. | |
| 9,425,162 | B2 | 8/2016 | Wasserman et al. | |
| 9,426,898 | B2 | 8/2016 | Frick et al. | |
| 9,478,516 | B2 | 10/2016 | Wasserman et al. | |
| 9,536,857 | B1 | 1/2017 | Kira et al. | |
| 9,576,928 | B2 | 2/2017 | Wasserman | |
| 2003/0116864 | A1 * | 6/2003 | Shi | H01L 24/29 257/E21.503 |
| 2006/0138643 | A1 * | 6/2006 | Lu | H01L 23/3128 257/E23.092 |
| 2009/0261149 | A1 | 10/2009 | Kazutaka | |
| 2011/0020983 | A1 * | 1/2011 | Tomura | H01L 21/563 428/305.5 |
| 2011/0132449 | A1 * | 6/2011 | Ramadas | H05B 33/10 428/419 |
| 2013/0255878 | A1 * | 10/2013 | Takahashi | H05K 3/305 156/288 |
| 2016/0343626 | A1 | 11/2016 | Colosimo et al. | |
| 2017/0207288 | A1 * | 7/2017 | Kang | H01L 27/326 |
| 2017/0250157 | A1 * | 8/2017 | Kim | H01L 21/76879 |
| 2018/0012815 | A1 * | 1/2018 | Li | H01L 24/83 |

FOREIGN PATENT DOCUMENTS

| | | | | |
|---|---|---|---|---|
| CN | 101960578 A | | 1/2011 | |
| JP | 2002-141373 A | | 5/2002 | |
| JP | 2010153670 A | * | 7/2010 | ........... H01L 21/563 |
| JP | 2013-191669 A | | 9/2013 | |
| KR | 10-2011-0031139 A | | 3/2011 | |
| WO | WO-2006129520 A1 | * | 12/2006 | ............. B29C 43/18 |
| WO | WO-2009128206 A1 | * | 10/2009 | ........... H01L 21/563 |

OTHER PUBLICATIONS

Chip Scale Review, The Future of Semiconductor Packaging, ChipScaleReview.com, vol. 19, No. 5, Sep.-Oct. 2015, 60 pages.
International Search Report from International Application No. PCT/US2018/034936, dated Sep. 19, 2018, 4 pages.
International Written Opinion from International Application No. PCT/US2018/034936, dated Sep. 19, 2018, 7 pages.
Taiwanese Office Action and Search Report from Taiwanese Application No. 107120270, dated Dec. 24, 2020, 17 pages.
Taiwanese Office Action for Application No. 107120270, dated Dec. 21, 2020, 12 pages.
Chinese First Office Action for Chinese Application No. 201880038539.2, dated Jan. 19, 2023, 17 pages with translation.

* cited by examiner

THERMOCOMPRESSION BOND TIPS AND RELATED APPARATUS AND METHODS

CROSS-REFERENCE TO RELATED APPLICATION

This application is a continuation of U.S. patent application Ser. No. 15/625,676, filed Jun. 16, 2017, now U.S. Pat. No. 11,024,595, issued Jun. 1, 2021, the disclosure of which is hereby incorporated herein in its entirety by this reference.

TECHNICAL FIELD

Embodiments disclosed herein relate to bond tips for thermocompression bonding. More particularly, embodiments disclosed herein relate to bond tips for use with a non-conductive film in thermocompression bonding between conductive elements of stacked electrical components, including, without limitation, semiconductor dice and other substrates.

BACKGROUND

Thermocompression bonding, hereinafter also referred to merely as "bonding" for simplicity, has been employed in semiconductor packaging technology for a substantial period of time. The process may be employed in bonding "flip-chip" dice configured with conductive elements in the form of bumps, balls, pillars or studs protruding from a die surface, typically an active surface. The conductive elements may be configured as so-called "C4" bumps comprising a solder ball on under bump metallization (UBM), "C2" bumps comprising a copper pillar with a solder cap, and as copper pillars for Cu-to-Cu diffusion bonding, also termed "direct" bonding.

As pin count of semiconductor devices has increased and the pitch between adjacent conductive elements has decreased significantly, C4 technology exhibits an increased potential for shorting between adjacent solder bumps during reflow of the relatively large solder mass of the bumps. C2 technology enables a relatively higher pin count and tighter pitch, with less shorting tendency. Cu-to-Cu direct bonding also offers higher pin counts and tighter pitches than C4 technology, but requires higher precision alignment of components.

The use of a pre-assembly underfill applied to a component to be bonded enables relatively tighter pillar-to-pillar pitches for C2 and Cu diffusion bonding technologies as compared to a post-assembly underfill, such as a capillary underfill (CUF), as well as enabling narrower bondlines between components. Pre-assembly underfill categories may be characterized as no-flow underfill (NUF) non-conductive paste (NCP) underfill and non-conductive film (NCF) underfill, the latter of which may also be referred to as wafer level underfill (WLUF). NUF or NCP may be applied at the die level to a component, for example, a semiconductor die having C2 or Cu pillars thereon, on the die surface and over the pillars by a spin-coating, needle dispense or vacuum-assist process, or at the wafer level to an array of unsingulated semiconductor dice. NCF underfill is applied at the wafer level by lamination of the film to a semiconductor die having C2 or Cu pillars thereon. In the case of C2 pillars, the NCF may also include a flux Example dimensions for C2 pillars include a 10 µm Cu pillar initially topped with a 40 µm Sn—Ag solder cap, a 26 µm Cu pillar capped with 2 µm Ni and 20 µm Sn, a 15 µm Cu pillar capped with 3 µm Ni and 15 µm Sn. It is also known to employ conductive elements comprising 5 µm Ni+Sn, with no copper pillar. Pillar-to-pillar pitch with pre-assembly underfill, such as a NUF, NCP or NCF underfill, may be as small as 10 µm, and bondlines when Cu pillars are employed, as thin as about 20 µm to about 30 µm. If no Cu pillar is employed, the bond line may be 15 µm or less.

NCF underfill lamination on a wafer may be effected relatively rapidly, is uniformly distributed over (for example) a die surface, enhancing the ability to achieve a uniform and void-free underfill. The NCF material is conventionally applied using a carrier film, for example a polyethylene terephthalate (PET) film, with the NCF material being pressed against the wafer surface with, for example, a roller. The carrier film is then stripped off, and a portion of the film depth may then optionally be removed (e.g., cut) to expose the solder of the cap. Even though less underfill material is required with NCF underfills in comparison to NUF and NCP technologies, reducing the potential for excess underfill outflow from between stacked components, there is still enough of a risk of sufficient outflow to contaminate the bond tip, which may also be characterized as the bond "tool," of the thermocompression bonding apparatus during a bonding operation. Controlling film thickness of the NCF material, as well as bonding process parameters, have been used to reduce the potential for formation of an excessively large "fillet" of underfill at the bondline periphery, but without complete success, reducing product yield.

FIG. 1 is a bottom elevation of a conventional bond tip 100, the bottom surface 102 of which, in use, contacts the back side of a semiconductor die, which may bear under-bump metallization (UBM). Conductive pillars protrude from an opposing, active surface of the semiconductor die. The bond head of a thermocompression bonding apparatus to which bond tip 100 is secured applies heat and pressure through bond tip 100 to effect a mechanical and electrical connection between each pillar and an aligned conductive element on a component below the die. Conventional bond tips employed in thermocompression bonding in conjunction with NCF (WLUF) are sized with a length and a width corresponding to no more than, a length and a width of a semiconductor die to be picked, placed, heated and pressed against a substrate for bonding, in order to avoid exposed peripheral areas of bottom surface 102 from being contacted with underfill material, such as an NCF material. However, conventional bond tips cannot be sized significantly smaller than the semiconductor die to be bonded, in order to place a uniform compressive force on a die for bonding and also to avoid a stress concentration that may crack the extremely thin dice, for example, about 50 µm or less, often employed in multi-die stacks and in mobile device chip assemblies. Die thicknesses as little as about 30 µm to about 40 µm are known. In addition, conventional bond tips cannot be sized significantly smaller than the semiconductor die to be bonded, as temperature uniformity of a sufficient magnitude for bonding must be maintained across the entire die area or interconnects near the die edge, near or outside of the bond tip periphery, may result in a poorly formed and connected solder joint, commonly referred to as a "cold joint."

Channels 104 in bottom surface 102, in communication with port 106, are used to apply a vacuum to pick a semiconductor die to be bonded with the bond head of the thermocompression bonding apparatus, and place the die in position for bonding to conductive elements of a substrate which may, without limitation, comprise another semiconductor die. In the case of C2 pillars, the applied heat is sufficient to melt the solder caps on the copper pillars, after which the bond tip is rapidly cooled to solidify the solder. In the case of Cu-to-Cu direct bonding, copper of the pillars is diffusion bonded to copper conductive elements of the substrate. During the bonding operation, NCF laminated to the active surface of the semiconductor die may flow outwardly as a fillet from the periphery of the die and sufficiently upwardly to contact and contaminate the bond tip, not only damaging the bond tip but placing future components contacted by the bond tip at risk for damage. In addition, if the fillet flows above the back side of the die or even onto the back side of the die, it presents a risk of die cracking when additional components are stacked and bonded onto the die.

One potential solution to bond tip contamination is the use of a film in strip form, a segment of which film is placed over the surface of the bond tip contacting the electrical component (e.g., semiconductor die) to be bonded prior to bonding, the film strip then being indexed after each bonding operation to cover the bond tip with a new film segment. Applicant herein does not admit that the foregoing apparatus or method constitutes prior art.

DETAILED DESCRIPTION

Figure 1:
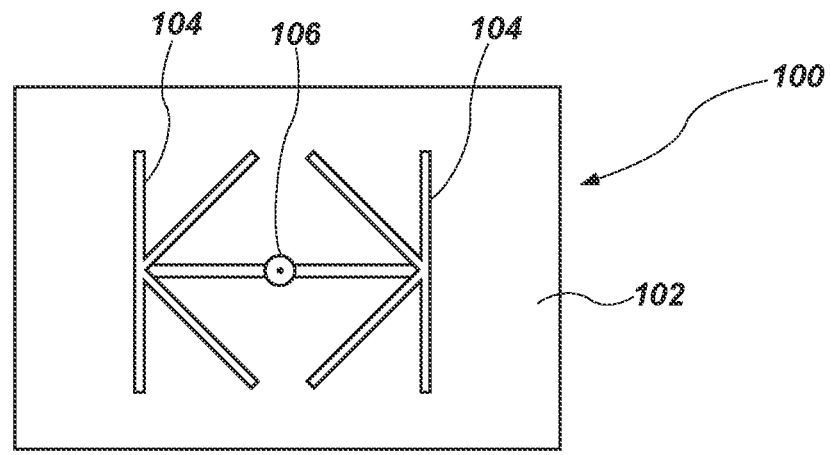
FIG. 1 is a bottom elevation of a conventional bond tip of a thermocompression bonding apparatus.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow, structure, or apparatus. Only those process acts and structures necessary to understand the embodiments of the disclosure are described in detail below.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

Disclosed is a thermocompression bonding apparatus comprising a bond tip having a bottom surface comprising a die contact area and a low surface energy (LSE) material covering at least a portion of the bottom surface.

Figure 2:
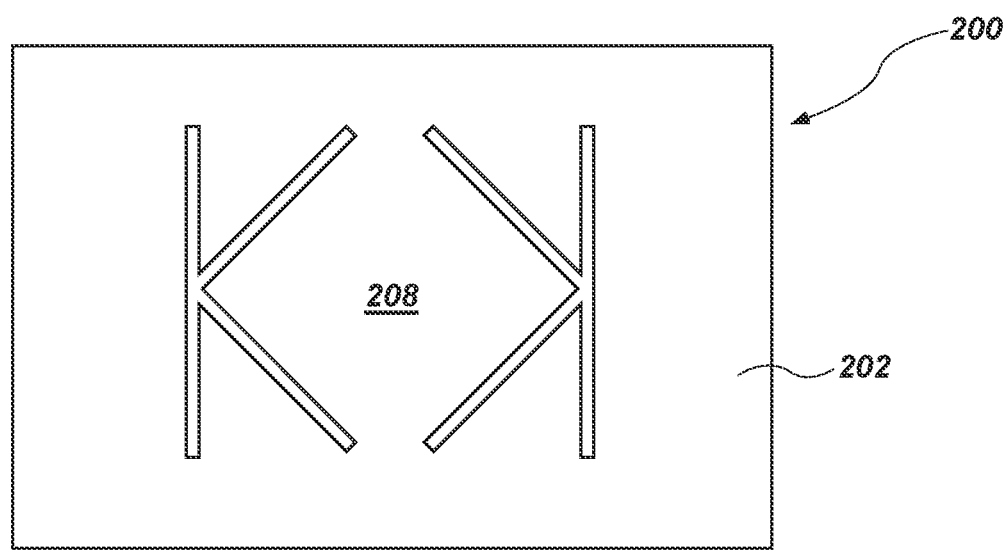
FIG. 2 is a bottom elevation of a bond tip according to an embodiment of the disclosure.

Referring now to FIG. 2 of the drawings, bottom surface 202 of bond tip 200 according to an embodiment of the disclosure is illustrated. As with bond tip 100, bond tip 200 includes channels (not shown) leading to a port (not shown) for application of a vacuum to hold a semiconductor die SD (see FIGS. 3A and 3B) for bonding by the back side 204 thereof against bottom surface 202. However, unlike bond tip 100, bottom surface 202 of bond tip 200 is covered with a low surface energy (LSE) material 208. LSE material 208 may comprise, for example, a parylene HT or N material, a fluoropolymer such as a polytetrafluoroethylene (PTFE) material or a perfluoroalkoxyl (PFA) material, graphene, or diamond-like-carbon (DLC). A particular material of the foregoing types may, or may be formulated to, accommodate the application of heat and remain in a solid state without decomposition at a temperature of, for example, about 300° C. or more as employed in a thermocompression bonding process. Thermocompression bonding temperatures as high as about 400° C. are known, and in theory could be as low as about 220° C., the melting point of Sn. Such LSE materials by definition resist wetting by a liquid, exhibiting a large contact angle to a drop of liquid placed on the surface of the LSE material, and resist adhesion to other materials. The LSE material 208 may cover bottom surface 202 in a thickness, for example, of about 2 µm to about 10 µm, although other thicknesses may be employed. For example, parylene may be conformally applied at a thickness from between about 0.1 µm to about 76 µm. The drawings herein exaggerate the thickness of the LSE material for clarity and, so are not to scale.

Figure 3A:
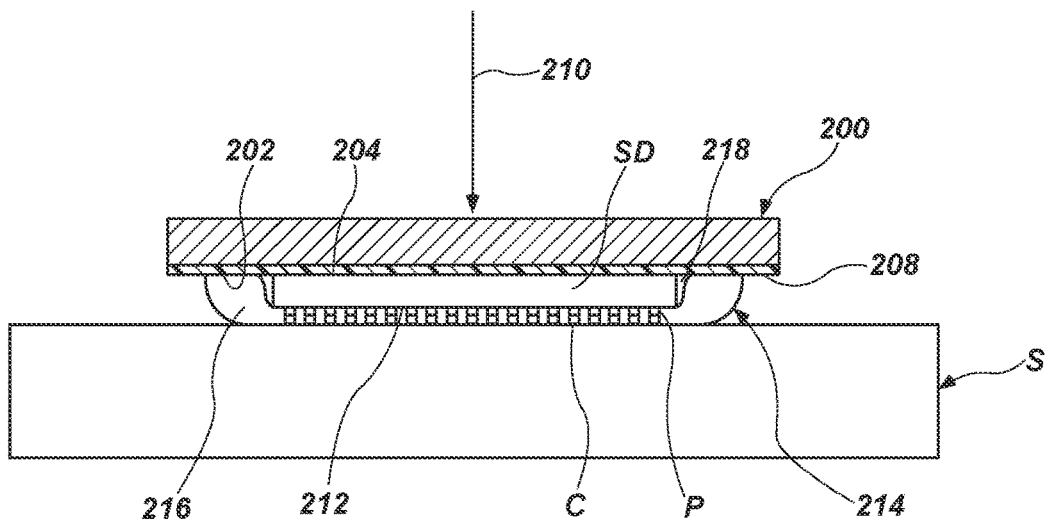
FIG. 3A is a schematic side elevation of the bond tip of FIG. 2 during a bonding operation of a semiconductor die.

Referring now to FIG. 3A, bond tip 200 is depicted bonding semiconductor die SD to substrate S under applied heat and pressure, the latter indicated by arrow 210 as the bond head (not shown) to which bond tip 200 is affixed applies a downward force. Under the applied heat and pressure, pillars P protruding from active surface 212 of semiconductor die SD penetrate NCF material 214 which has been previously applied at the wafer level, prior to singulation, into contact with aligned conductive elements C of substrate S. As a result of the application of heat and pressure NCF material 214 (shown as transparent for clarity) becomes flowable and flows outwardly and upwardly as fillet 216 from between semiconductor die SD and substrate S along the periphery 218 of semiconductor die SD. As bottom surface 202 of bond tip 200 is covered with LSE material 208, while fillet 216 may contact bottom surface 202, LSE material 208 prevents contamination of bond tip 200. Notably, and unlike conventional bond tips, due to the presence of LSE material 208 on bottom surface 202, bond tip 200 may be of greater width and length than a width and length of semiconductor die SD, preventing fillet 216 from reaching, and contaminating, the back side of semiconductor die SD. By way of example only, bond tip 200 may extend a lateral distance of as much as about 1 mm or more beyond the periphery 218 of semiconductor die SD. The ability to employ a bond tip 200 of significantly larger size than conventional bond tips enables the use of one "oversize" bond tip for many differently sized and shaped semiconductor dice, saving tooling costs.

Figure 3B:
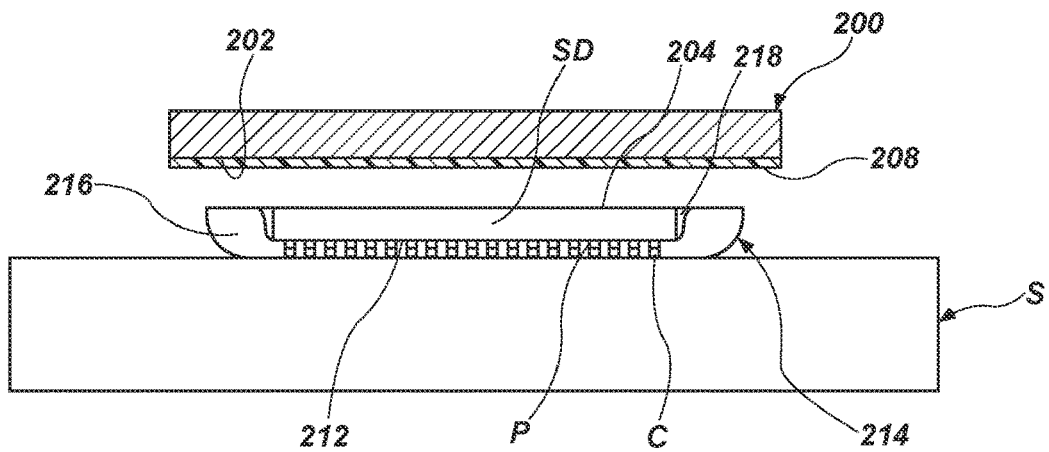
FIG. 3B is a schematic side elevation of the bond tip of FIG. 2 after bonding of the semiconductor die.

As shown in FIG. 3B, after the bonding operation and the NCF material 214 has partially cured, bond tip 200 may be released from contact with semiconductor die SD when the bonded assembly is sufficiently cooled, without adhesion to, and contamination by, the NCF material of fillet 216. Active cooling of the bond tip 200 prior to die release may be employed, but may not be necessary to save cycle time, as partially cured NCF can hold the semiconductor die SD in place, so that the bond tip cooling cycle can be started after die release and while the bond head moves to pick up the next semiconductor die for bonding.

Figure 4:
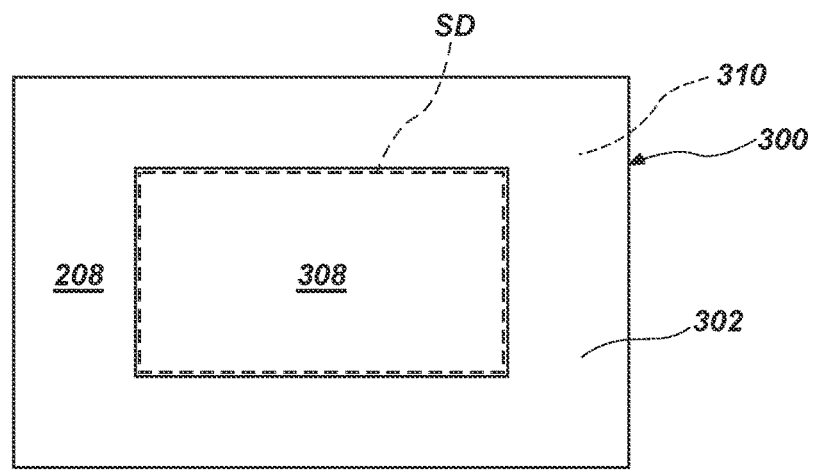
FIG. 4 is a bottom elevation of a bond tip according to another embodiment of the disclosure.

Referring now to FIG. 4, a bottom surface 302 of another embodiment of a bond tip 300 according to the disclosure is illustrated. As with bond tip 200, bottom surface 302 includes vacuum channels in communication with a vacuum port (not shown). LSE material 208, as described above with respect to FIGS. 2, 3A and 3B, is employed on bottom surface 302. However, bottom surface 302 of bond tip 300 is only partially covered with LSE material 208, LSE material 208 located only outside of die contact area 308 on peripheral portion 310. A semiconductor die SD is shown in broken lines on die contact area 308.

Figure 5A:
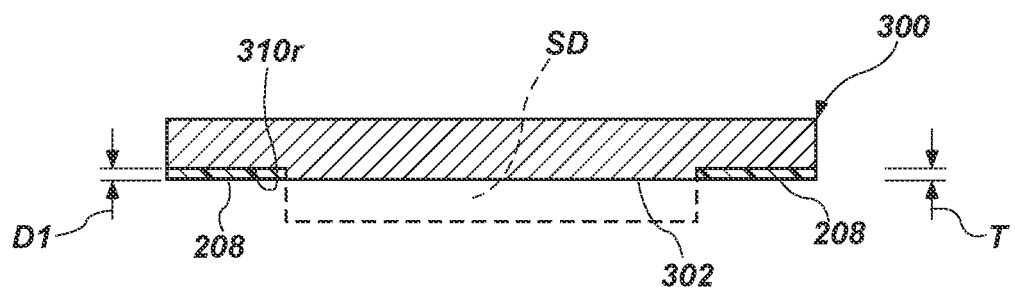
FIG. 5A is a schematic side sectional elevation of an implementation of the bond tip of FIG. 4.

As depicted in FIG. 5A, which is a schematic side sectional elevation of one implementation of bond tip 300, bottom surface 302 may include a recessed peripheral portion 310r outside of die contact area 308, depth D1 of the recessed peripheral portion 310r substantially corresponding to a thickness T of LSE material 208, so that the covered and uncovered portions of bottom surface 302 are substantially coplanar. With the configuration of FIG. 5A, a fillet of NCF material (not shown) may contact the sides of semiconductor die SD (shown in broken lines) as well as LSE material 208 on recessed peripheral portion 310r during bonding, but will be precluded from contacting the back side of semiconductor die SD by contact with LSE material 208 on recessed peripheral portion 310r, from which the fillet will release when bond tip 300 is retracted.

Figure 5B:
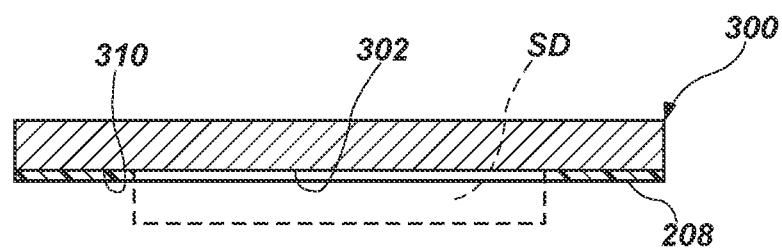
FIG. 5B is a schematic side sectional elevation of another implementation of the bond tip of FIG. 4.

As depicted in FIG. 5B, which is a schematic side sectional elevation of another implementation of bond tip 300, bottom surface 302 is substantially planar across its entire length and width, and a thickness T of LSE material 208 is applied to peripheral portion 310 outside of die contact area 308, so that the uncovered die contact area 308 of bottom surface 302 is recessed relative to the outer surface of LSE material. A semiconductor die SD is shown in broken lines on die contact area 308. With the configuration of FIG. 5B, a fillet of NCF material (not shown) may be prevented from contacting at least portions of the sides of semiconductor die SD adjacent die contact area 308 during bonding due to the presence of LSE material 208 protruding from bottom surface 302 over peripheral portion 310, and will release from LSE material 208 on peripheral portion 310 when bond tip 300 is retracted.

Figure 6:
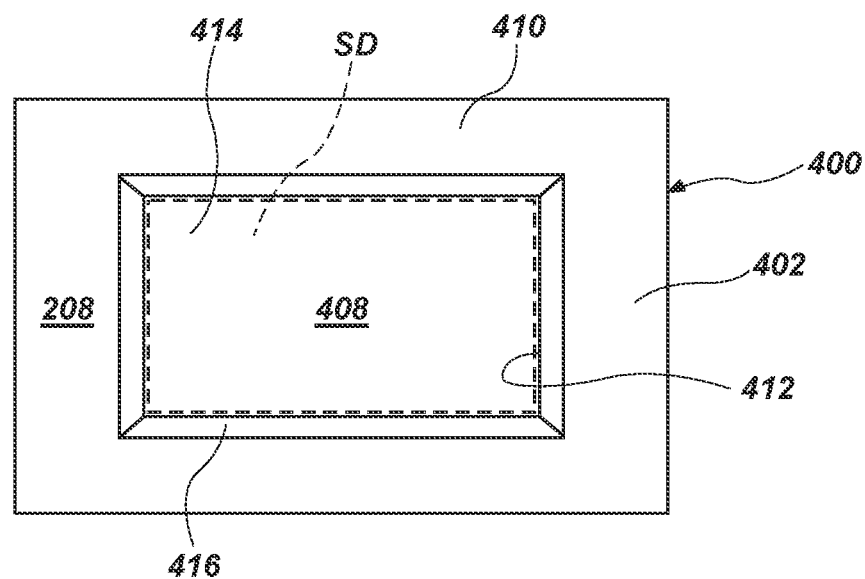
FIG. 6 is a bottom elevation of a bond tip according to a further embodiment of the disclosure.

Referring now to FIG. 6, a bottom surface 402 of another embodiment of a bond tip 400 according to the disclosure is illustrated. As with bond tips 200 and 300, bottom surface 402 includes vacuum channels in communication with a port. LSE material 208, as described above with respect to FIGS. 2 through 5B, is employed on bottom surface 402. However, as with bottom surface 302 of bond tip 300, bottom surface 402 is only partially covered with LSE material 208 peripherally of die contact area 408, and outside of die contact area 408 on peripheral portion 410 of bottom surface 402. Further, as compared to the previous embodiments, die contact area 408 may be substantially recessed in comparison to peripheral portion 410, by a depth D2 (see FIG. 7A) substantially corresponding to a thickness of semiconductor die SD, plus a distance less than a height of pillars P protruding from the active surface of semiconductor die SD. Stated another way, maximum depth D2 may be as great as a thickness of semiconductor die SD, plus a value less than pillar height. Minimum depth D2 may be less than the thickness of semiconductor die SD, depth D2 being somewhat process dependent. Recess 414 is dimensioned with a length and a width exhibiting a tight tolerance, for example, plus about 50 μm to about 300 μm to the length and the width of semiconductor die SD to be bonded to substantially prevent an NCF fillet from flowing up the sides of semiconductor die SD and onto the back side thereof. In addition, a transition between each vertical sidewall 412 of recess 414 circumscribing die contact area 408 and an adjacent area of peripheral portion 410 may comprise a laterally outwardly extending chamfer 416, which may prevent damage to semiconductor die SD if there is a slight misalignment between bond tip 400 and the die when the latter is picked from a singulated wafer on a film frame. Chamfer 416 may lie, for example, at about a 30° angle to about a 60° angle an associated sidewall 412, such as at about a 45° angle. Chamfer 416 is covered with LSE material 208 contiguously with peripheral portion 410 of bottom surface 402.

Figure 7A:
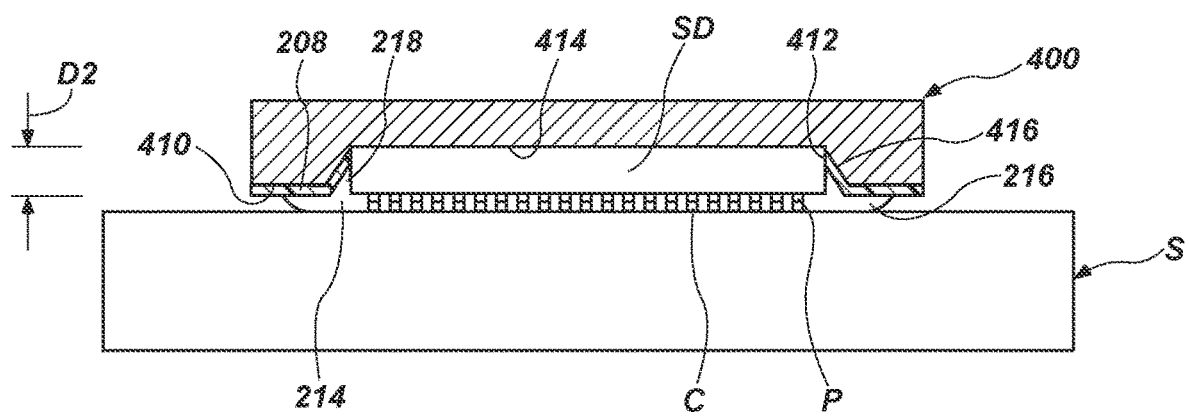
FIG. 7A is a schematic partial sectional side elevation of the bond tip of FIG. 6 during a bonding operation of a semiconductor die.
Figure 7B:
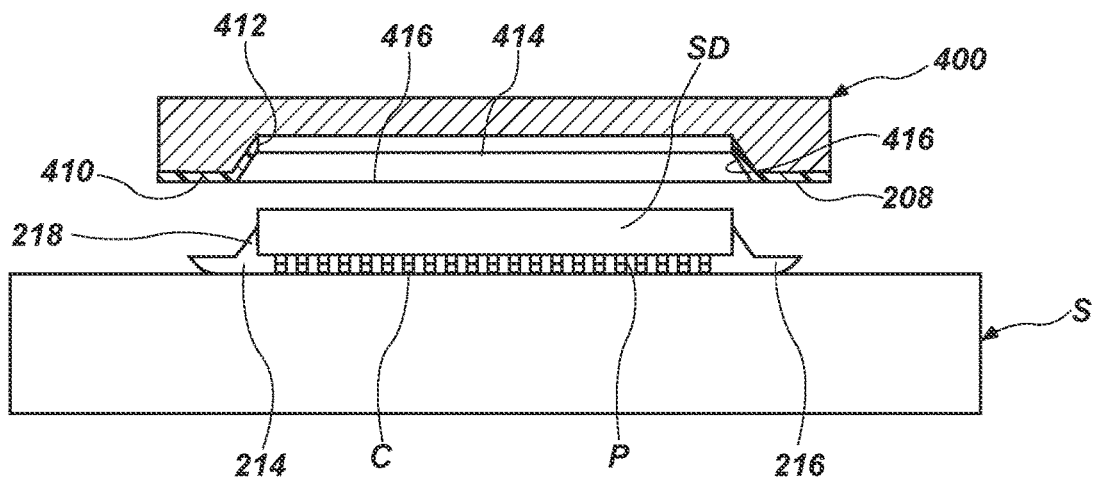
FIG. 7B is a schematic side partial sectional elevation of the bond tip of FIG. 6 after bonding of the semiconductor die.

As shown in FIG. 7A, when bond tip 400 applies heat and pressure to semiconductor die SD when bonding to another substrate S, a fillet 216 of NCF material 214 (shown as transparent for clarity) may form around the die periphery, and an excess quantity of NCF material 214 from fillet 216 may flow up onto chamfer 416 as a peripheral protrusion 218. Unlike bond tips 200 and 300, the tight tolerance of recess 414 with respect to semiconductor die SD constrains the potential upward extent of fillet 216, so that chamfer 416 provides additional spatial volume into which NCF fillet 216 may flow. Thus, the lateral extent of protrusion of NCF fillet 216 beyond the sides of semiconductor die SD can be limited by extrusion of excess NCF material 214 into the additional spatial volume, such that integrity is not compromised of a subsequent overmolding of encapsulant material on semiconductor die SD with other dice in a stack, or on an interposer or other substrate. As shown in FIG. 7B, when NCF material 214 is at least partially cured, the fillet 216 will release from the LSE material 208. As noted above, active cooling of the bond head and bond tip prior to die release is not necessary to implementation of embodiments of the present disclosure.

Disclosed is a method of thermocompression bonding a semiconductor die comprising pillars protruding from a surface thereof, the method comprising picking the semiconductor die bearing a non-conductive film (NCF) over the surface from which the pillars protrude with a die contact area of a bottom surface of a bond tip of a thermocompression bonding apparatus, the bottom surface having a length and a width greater than a length and a width of the semiconductor die, leaving a peripheral portion of the bottom surface around the die contact area exposed, moving the semiconductor die with the bond tip to a position with the pillars aligned with conductive elements of a substrate, applying heat to the semiconductor die and transforming NCF material to a flowable state, applying force to the semiconductor die with the bond tip during application of heat to press the pillars against the aligned conductive elements, fill a bondline between the semiconductor die and the substrate with flowable NCF material around and between the pillars and cause at least one fillet of the flowable NCF material to extrude from at least a portion of a periphery of the semiconductor die and contact at least part of the exposed peripheral portion of the bottom surface of the bond tip, bonding the pillars to the aligned conductive elements and letting the NCF material at least partially cure, and retracting the bond tip from the semiconductor die without adhesion of the NCF material of the fillet to the exposed peripheral portion.

Embodiments of the disclosure may be employed, for example and without limitation, in thermocompression bonding of a semiconductor die to a supporting substrate such as an interposer, a circuit board or other higher level packaging, or to another semiconductor die. Nonlimiting examples of the latter include thermocompression bonding of memory dice to form a stack of, for example, four, eight, twelve or sixteen dice, as well as to form a stack of memory dice on a logic die or a system on a chip (SoC) die. One example of a multi-die assembly which may be fabricated employing embodiments of the disclosure is a Hybrid Memory Cube, comprising multiple (commonly four) DRAM dice stacked on a controller die.

Figure 8:
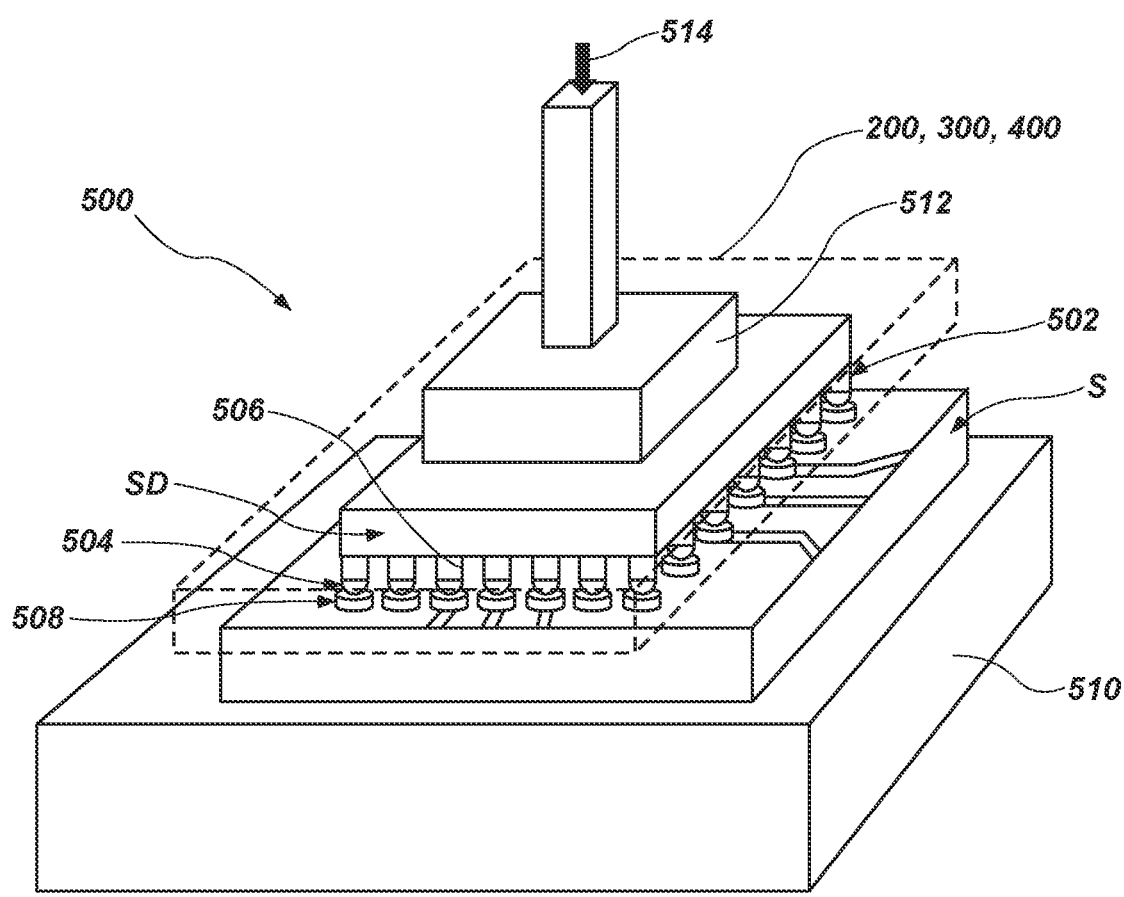
FIG. 8 is a simplified schematic perspective view of a thermocompression bonding apparatus employing a bond tip of an embodiment of the disclosure.

Thermocompression bonding apparatuses are well known in the art. For example, U.S. Pat. Nos. 8,967,452; 9,093,549; 9,425,162; 9,426,898; 9,478,516; 9,576,928 and U.S. Patent Application Publication 2016/0343626 describe such apparatuses. Bond tips according to embodiments of the disclosure may be employed with an otherwise conventional thermocompression bonding apparatus without modification of the existing apparatus, except for replacement of a conventional bond tip. FIG. 8 illustrates a simplified schematic of a thermocompression bonding apparatus 500 employing a bond tip 200, 300 or 400. As shown in FIG. 8, a semiconductor die SD having C2 pillars comprising copper pillars 502 capped with solder 504 and protruding from active surface 506 is aligned with conductive elements 508 in the form of terminal pads of substrate S. By way of example only, substrate S is depicted in the form of a circuit board, substrate S being supported on platform 510 for bonding. Bond tip 200, 300, 400, shown in broken lines for comparison to a conventional bond tip 512, has been used to pick semiconductor die SD and place it in alignment with substrate S for bonding and to apply a compressive force, shown by arrow 514, to semiconductor die SD. As previously described, bond tip 200, 300 and 400 exhibits a length and a width greater than a length and a width of semiconductor die SD. Heat sufficient to cause reflow of solder 504 may be applied through platform 510, through bond tip 200, 300, 400 from a bond head (not shown) to which bond tip 200, 300, 400 is secured, and/or from other sources. After bonding, the assembly of semiconductor die SD and substrate S is cooled, and removed from platform 510 after bond tip 200, 300, 400 is retracted.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A thermocompression-bonding apparatus, comprising:
a bond tip, the thermocompression-bonding apparatus configured to apply heat and pressure to a semiconductor directly by a bottom surface of the bond tip, the bottom surface comprising:
a planar die-contact area, a length and a width of the planar die-contact area substantially corresponding to a length and a width of a semiconductor die to be received on the planar die-contact area;
a planar peripheral portion surrounding the planar die-contact area, the planar peripheral portion oriented parallel to the planar die-contact area; and
a low-surface-energy material secured to the planar peripheral portion of the bottom surface, wherein the low-surface-energy material is absent from the planar die-contact area.

2. The thermocompression-bonding apparatus of claim 1, wherein a thickness of the low-surface-energy material has an inner boundary comprising sidewalls of the thickness of the low-surface-energy material.

3. The thermocompression-bonding apparatus of claim 2, wherein the sidewalls are located and configured to contact sides of a semiconductor die when the semiconductor die is received on the planar die-contact area.

4. The thermocompression-bonding apparatus of claim 1, wherein the planar peripheral portion is recessed relative to the planar die-contact area.

5. The thermocompression-bonding apparatus of claim 4, wherein, a thickness of the low-surface-energy material corresponds to a depth of the recession of the planar peripheral portion relative to the planar die-contact area such that a bottom surface of the low-surface-energy material is coplanar with the planar die-contact area.

6. The thermocompression-bonding apparatus of claim 1, wherein the planar die-contact area is recessed relative to the planar peripheral portion.

7. The thermocompression-bonding apparatus of claim 6, further comprising a transition between the planar die-contact area and the planar peripheral portion, the transition comprising angled surfaces extending laterally between the planar die-contact area and the planar peripheral portion.

8. The thermocompression-bonding apparatus of claim 7, wherein the low-surface-energy material extends over and is secured to the angled surfaces of the transition.

9. The thermocompression-bonding apparatus of claim 8, wherein a thickness of the low-surface-energy material is less than a depth of the recession of the planar die-contact area relative to the planar peripheral portion.

10. The thermocompression-bonding apparatus of claim 6, wherein a depth of the recession of the planar die-contact area relative to the planar peripheral portion is greater than a thickness of a semiconductor die to be received on the planar die-contact area.

11. The thermocompression-bonding apparatus of claim 10, wherein the depth of the recession of the planar die-contact area relative to the planar peripheral portion is greater than the thickness of the semiconductor die to be received on the planar die-contact area by a depth less than a height of pillars of the semiconductor die to be received on the planar die-contact area.

12. The thermocompression-bonding apparatus of claim 1, wherein the planar die-contact area defines a vacuum-channel opening for application of a suction force directly to a top surface of the semiconductor die to retain the semiconductor die on the planar die-contact area, the planar die-contact area to directly contact the top surface of the semiconductor die.

13. A method of thermocompression bonding a semiconductor die to a substrate, the method comprising:
picking a semiconductor die using a bond tip having a bottom surface, the bottom surface comprising: a planar die-contact area, a length and a width of the planar die-contact area substantially corresponding to a length and a width of the semiconductor die; a planar peripheral portion surrounding the planar die-contact area, the planar peripheral portion oriented parallel to the planar die-contact area; and a low-surface-energy material located only on and secured to the planar peripheral portion of the bottom surface;
placing the semiconductor die on the substrate;
applying heat and force to the semiconductor die through the bond tip; and
retracting the bond tip with the low-surface-energy material secured to the planar portion of the bottom surface.

14. The thermocompression-bonding apparatus of claim 1, wherein the low-surface-energy material is located entirely within a footprint of the bottom surface of the bond tip.

15. The thermocompression-bonding apparatus of claim 1, wherein the low-surface-energy material is permanently affixed to the planar peripheral portion of the bottom surface.

16. The thermocompression-bonding apparatus of claim 1, wherein the planar die-contact area defines a vacuum-channel opening for application of a suction force directly to a top surface of the semiconductor die to retain the semiconductor die on the bottom surface of the bond tip.

17. The method of claim 13, wherein picking the semiconductor die comprises applying suction force directly to a top surface of the semiconductor die through a vacuum-channel opening defined through the planar die-contact area of the bottom surface of the bond tip.

18. A thermocompression-bonding apparatus, comprising:
a bond tip, the thermocompression-bonding apparatus configured to apply heat and pressure to a semiconductor through a bottom surface of the bond tip, the bottom surface of the bond tip comprising:
a planar die-contact area, a length and a width of the planar die-contact area substantially corresponding to a length and a width of a semiconductor die to be received on the planar die-contact area;
a planar peripheral portion surrounding the planar die-contact area, the planar peripheral portion oriented parallel to the planar die-contact area; and
a low-surface-energy material located only on and permanently affixed to the planar peripheral portion of the bottom surface, the low-surface-energy material located entirely within a footprint of the bottom surface of the bond tip.

* * * * *